(12) United States Patent
Kato et al.

(10) Patent No.: US 8,177,138 B2
(45) Date of Patent: May 15, 2012

(54) RADIO IC DEVICE

(75) Inventors: Noboru Kato, Moriyama (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/080,775

(22) Filed: Apr. 6, 2011

(65) Prior Publication Data

US 2011/0186641 A1   Aug. 4, 2011

Related U.S. Application Data

(63) Continuation of application No. PCT/JP2009/067778, filed on Oct. 14, 2009.

(30) Foreign Application Priority Data

Oct. 29, 2008   (JP) ................................ 2008-278603

(51) Int. Cl.
G06K 19/06   (2006.01)
(52) U.S. Cl. .................................... 235/492; 340/572.7
(58) Field of Classification Search ........... 340/572.1–8; 343/700
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,528,222 A | 6/1996 | Moskowitz et al. | |
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,311 A | 8/2000 | Lastinger | |
| 6,107,920 A | 8/2000 | Eberhardt et al. | |
| 6,172,608 B1 | 1/2001 | Cole | |

(Continued)

FOREIGN PATENT DOCUMENTS

DE   10 2006 057 369 A1   6/2008
(Continued)

OTHER PUBLICATIONS

Official communication issued in counterpart International Application No. PCT/JP2008/071502, mailed Feb. 24, 2009.

(Continued)

Primary Examiner — Thien M. Le
Assistant Examiner — Christle Marshall
(74) Attorney, Agent, or Firm — Keating & Bennett, LLP

(57) ABSTRACT

A radio IC device that is highly efficient in transmitting signals from a radio IC to a radiation pattern includes a radio IC chip arranged to processes radio signals, an auxiliary electrode pattern that is connected to the radio IC chip and includes a loop-shaped electrode, and a radiation electrode pattern that includes a magnetic-field radiation electrode having a resonant frequency and an electric-field radiation electrode having a resonant frequency. The loop-shaped electrode of the auxiliary electrode pattern is coupled to a maximum-voltage section of the magnetic-field radiation electrode through a capacitor.

8 Claims, 12 Drawing Sheets

U.S. PATENT DOCUMENTS

| | | |
|---|---|---|
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 * | 7/2008 | Sakama et al. ............. 340/572.7 |
| 7,830,311 B2 * | 11/2010 | Kataya et al. ......... 343/700 MS |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0231106 A1 | 9/2009 | Okamura |
| 2009/0262041 A1 | 10/2009 | Ikemoto et al. |
| 2010/0103058 A1 * | 4/2010 | Kato et al. ..................... 343/702 |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-193849 A | 7/1998 |
| JP | 10-193851 A | 7/1998 |

| | | | | | | |
|---|---|---|---|---|---|---|
| JP | 10-293828 | A | 11/1998 | JP | 2002-252117 A | 9/2002 |
| JP | 11-039441 | A | 2/1999 | JP | 2002-259934 A | 9/2002 |
| JP | 11-075329 | A | 3/1999 | JP | 2002-280821 A | 9/2002 |
| JP | 11-085937 | A | 3/1999 | JP | 2002-298109 A | 10/2002 |
| JP | 11-88241 | A | 3/1999 | JP | 2002-308437 A | 10/2002 |
| JP | 11-102424 | A | 4/1999 | JP | 2002-319008 A | 10/2002 |
| JP | 11-103209 | A | 4/1999 | JP | 2002-319009 A | 10/2002 |
| JP | 11-149536 | A | 6/1999 | JP | 2002-319812 A | 10/2002 |
| JP | 11-149538 | A | 6/1999 | JP | 2002-362613 A | 12/2002 |
| JP | 11-219420 | A | 8/1999 | JP | 2002-373029 A | 12/2002 |
| JP | 11-220319 | A | 8/1999 | JP | 2002-373323 A | 12/2002 |
| JP | 11-328352 | A | 11/1999 | JP | 2002-374139 A | 12/2002 |
| JP | 11-346114 | A | 12/1999 | JP | 2003-006599 A | 1/2003 |
| JP | 11-515094 | A | 12/1999 | JP | 2003-016412 A | 1/2003 |
| JP | 2000-21128 | A | 1/2000 | JP | 2003-026177 A | 1/2003 |
| JP | 2000-021639 | A | 1/2000 | JP | 2003-030612 A | 1/2003 |
| JP | 2000-022421 | A | 1/2000 | JP | 2003-44789 A | 2/2003 |
| JP | 2005-229474 | A | 1/2000 | JP | 2003-046318 A | 2/2003 |
| JP | 2000-059260 | A | 2/2000 | JP | 2003-58840 A | 2/2003 |
| JP | 2000-085283 | A | 3/2000 | JP | 2003-067711 A | 3/2003 |
| JP | 2000-090207 | A | 3/2000 | JP | 2003-069335 A | 3/2003 |
| JP | 2000-132643 | A | 5/2000 | JP | 2003-076947 A | 3/2003 |
| JP | 2000-137778 | A | 5/2000 | JP | 2003-76963 A | 3/2003 |
| JP | 2000-137779 | A | 5/2000 | JP | 2003-78333 A | 3/2003 |
| JP | 2000-137785 | A | 5/2000 | JP | 2003-078336 A | 3/2003 |
| JP | 2000-148948 | A | 5/2000 | JP | 2003-085501 A | 3/2003 |
| JP | 2000-172812 | A | 6/2000 | JP | 2003-085520 A | 3/2003 |
| JP | 2000-209013 | A | 7/2000 | JP | 2003-87008 A | 3/2003 |
| JP | 2000-222540 | A | 8/2000 | JP | 2003-87044 A | 3/2003 |
| JP | 2000-510271 | A | 8/2000 | JP | 2003-099720 A | 4/2003 |
| JP | 2000-242754 | A | 9/2000 | JP | 2003-099721 A | 4/2003 |
| JP | 2000-243797 | A | 9/2000 | JP | 2003-110344 A | 4/2003 |
| JP | 2000-251049 | A | 9/2000 | JP | 2003-132330 A | 5/2003 |
| JP | 2000-261230 | A | 9/2000 | JP | 2003-134007 A | 5/2003 |
| JP | 2000-276569 | A | 10/2000 | JP | 2003-155062 A | 5/2003 |
| JP | 2000-286634 | A | 10/2000 | JP | 2003-158414 A | 5/2003 |
| JP | 2000-286760 | A | 10/2000 | JP | 2003-168760 A | 6/2003 |
| JP | 2000-311226 | A | 11/2000 | JP | 2003-179565 A | 6/2003 |
| JP | 2000-321984 | A | 11/2000 | JP | 2003-187207 A | 7/2003 |
| JP | 3075400 | U | 11/2000 | JP | 2003-187211 A | 7/2003 |
| JP | 2000-349680 | A | 12/2000 | JP | 2003-188338 A | 7/2003 |
| JP | 2001-10264 | A | 1/2001 | JP | 2003-188620 A | 7/2003 |
| JP | 2001-028036 | A | 1/2001 | JP | 2003-198230 A | 7/2003 |
| JP | 2007-18067 | A | 1/2001 | JP | 2003-209421 A | 7/2003 |
| JP | 2001-043340 | A | 2/2001 | JP | 2003-216919 A | 7/2003 |
| JP | 2001-66990 | A | 3/2001 | JP | 2003-218624 A | 7/2003 |
| JP | 2001-76111 | A | 3/2001 | JP | 2003-233780 A | 8/2003 |
| JP | 2001-505682 | A | 4/2001 | JP | 2003-242471 A | 8/2003 |
| JP | 2001-168628 | A | 6/2001 | JP | 2003-243918 A | 8/2003 |
| JP | 2001-188890 | A | 7/2001 | JP | 2003-249813 A | 9/2003 |
| JP | 2001-240046 | A | 9/2001 | JP | 2003-529163 A | 9/2003 |
| JP | 2001-256457 | A | 9/2001 | JP | 2003-288560 A | 10/2003 |
| JP | 2001-257292 | A | 9/2001 | JP | 2003-309418 A | 10/2003 |
| JP | 2001-514777 | A | 9/2001 | JP | 2003-317060 A | 11/2003 |
| JP | 2001-319380 | A | 11/2001 | JP | 2003-331246 A | 11/2003 |
| JP | 2001-331976 | A | 11/2001 | JP | 2003-332820 A | 11/2003 |
| JP | 2001-332923 | A | 11/2001 | JP | 2003-536302 A | 12/2003 |
| JP | 2001-339226 | A | 12/2001 | JP | 2004-040597 A | 2/2004 |
| JP | 2001-344574 | A | 12/2001 | JP | 2004-505481 A | 2/2004 |
| JP | 2001-351084 | A | 12/2001 | JP | 2004-082775 A | 3/2004 |
| JP | 2001-352176 | A | 12/2001 | JP | 2004-88218 A | 3/2004 |
| JP | 2002-024776 | A | 1/2002 | JP | 2004-93693 A | 3/2004 |
| JP | 2002-026513 | A | 1/2002 | JP | 2004-096566 A | 3/2004 |
| JP | 2002-32731 | A | 1/2002 | JP | 2004-127230 A | 4/2004 |
| JP | 2002-042076 | A | 2/2002 | JP | 2004-213582 A | 7/2004 |
| JP | 2002-063557 | A | 2/2002 | JP | 2004-519916 A | 7/2004 |
| JP | 2002-505645 | A | 2/2002 | JP | 2004-234595 A | 8/2004 |
| JP | 2002-076750 | A | 3/2002 | JP | 2004-253858 A | 9/2004 |
| JP | 2002-76750 | A | 3/2002 | JP | 2004-527864 A | 9/2004 |
| JP | 2002-150245 | A | 5/2002 | JP | 2004-280390 A | 10/2004 |
| JP | 2002-157564 | A | 5/2002 | JP | 2004-287767 A | 10/2004 |
| JP | 2002-158529 | A | 5/2002 | JP | 2004-297249 A | 10/2004 |
| JP | 2002-175508 | A | 6/2002 | JP | 2004-297681 A | 10/2004 |
| JP | 2002-183690 | A | 6/2002 | JP | 2004-304370 A | 10/2004 |
| JP | 2002-185358 | A | 6/2002 | JP | 2004-319848 A | 11/2004 |
| JP | 2002-204117 | A | 7/2002 | JP | 2004-326380 A | 11/2004 |
| JP | 2002-522849 | A | 7/2002 | JP | 2004-334268 A | 11/2004 |
| JP | 2002-230128 | A | 8/2002 | JP | 2004-336250 A | 11/2004 |
| JP | 2002-232221 | A | 8/2002 | JP | 2004-343000 A | 12/2004 |

| | | |
|---|---|---|
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-42097 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-28002 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-172369 A | 7/2007 |
| JP | 2007-172527 A | 7/2007 |
| JP | 2007-228325 A | 9/2007 |
| JP | 2007-266999 A | 10/2007 |
| JP | 2007-287128 A | 11/2007 |
| JP | 2007-312350 A | 11/2007 |
| JP | 2007-324865 A | 12/2007 |
| JP | 2008-033716 A | 2/2008 |
| JP | 2008-72243 A | 3/2008 |
| JP | 4069958 B2 | 4/2008 |
| JP | 2008-107947 A | 5/2008 |
| JP | 2008-148345 A | 6/2008 |
| JP | 2008-519347 A | 6/2008 |
| JP | 2008-160874 A | 7/2008 |
| JP | 11-175678 A | 1/2009 |
| JP | 2009-25870 A | 2/2009 |
| JP | 2009-27291 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 01/95242 A2 | 12/2001 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/102360 A1 | 9/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/140037 A1 | 11/2008 |
| WO | 2009/011376 A1 | 1/2009 |
| WO | 2009/081719 A1 | 7/2009 |
| WO | 2009/110381 A1 | 9/2009 |

OTHER PUBLICATIONS

Kato et al.: "Wireless IC Device and Manufacturing Method Thereof," U.S. Appl. No. 12/432,854, filed Apr. 30, 2009.

Official communication issued in counterpart International Application No. PCT/JP2008/058168, mailed Aug. 12, 2008.

Official communication issued in counterpart International Application No. PCT/JP2008/062886, mailed Oct. 21, 2008.

Kato et al.: "Wireless IC Device," U.S. Appl. No. 12/469,896, filed May 21, 2009.

Ikemoto et al.: "Wireless IC Device," U.S. Appl. No. 12/496,709, filed Jul. 2, 2009.

Official communication issued in counterpart International Application No. PCT/JP2008/062947, mailed Aug. 19, 2008.

Official communication issued in counterpart International Application No. PCT/JP2008/056026, mailed Jul. 1, 2008.

Ikemoto et al.: "Wireless IC Device and Electronic Apparatus," U.S. Appl. No. 12/503,188, filed Jul. 15, 2009.

Official communication issued in counterpart International Application No. PCT/JP2008/055567, mailed May 20, 2008.

Official communication issued in counterpart International Application No. PCT/JP2008/051853, mailed Apr. 22, 2008.

Official communication issued in counterpart International Application No. PCT/JP2008/057239, mailed Jul. 22, 2008.

Kimura et al.: "Wireless IC Device," U.S. Appl. No. 12/510,338, filed Jul. 28, 2009.

Kato et al.: "Wireless IC Device," U.S. Appl. No. 12/510,340, filed Jul. 28, 2009.

Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.

Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.

Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Kato: "Wireless IC Devices"; U.S. Appl. No. 12/429,346, filed Apr. 24, 2009.

* cited by examiner

RADIO IC DEVICE

BACKGROUND OF THE INVENTION

1. Field of the Invention

The present invention relates to radio IC devices including a radio IC and a radiation electrode pattern, and in particular, to a radio IC device used in an RFID (Radio Frequency Identification) system.

2. Description of the Related Art

In recent years, RFID systems, in which a reader/writer that generates an induction field and an IC tag (hereinafter referred to as a radio IC device) that is attached to an article and stores predetermined information communicate with each other by a non-contact method using an electromagnetic field to transmit the predetermined information, have been developed as an article management system.

Radio IC devices used in such an RFID system include a radio IC chip that processes a predetermined radio signal and a radiation electrode pattern that performs transmission and reception of the radio signal, and a known radio IC device is described in, for example, International Patent Publication No. WO2007/083574.

The radio IC device in International Patent Publication No. WO2007/083574 includes a radio IC chip, a feeder circuit board, on which the radio IC chip is mounted, which is provided with a feeder circuit including a resonant circuit having a predetermined resonant frequency, and a radiation electrode pattern which is attached to the lower surface of the feeder circuit board, and which radiates a transmission signal supplied from the feeder circuit and receives and supplies a reception signal to the feeder circuit. The radio IC device is designed so that the resonant frequency of the resonant circuit of the feeder circuit board substantially corresponds to the frequency of the transmission/reception signals, and thus, has a very stable frequency characteristic.

In the radio IC device described in International Patent Publication No. WO2007/083574, the frequency of the radio signals transmitted from/received by the radiation electrode pattern is substantially determined in the feeder circuit of the feeder circuit board, and thus, is nearly independent of the size or shape of the radiation electrode pattern. In addition, in International Patent Publication No. WO2007/083574, a technique for providing the radio IC chip on a rigid feeder circuit board and coupling the feeder circuit and the radiation electrode pattern to each other through a magnetic field or an electric field is disclosed as a technique to facilitate providing the radio IC chip on the radiation electrode pattern.

However, when the feeder circuit board and the radiation electrode pattern are coupled to each other through a magnetic field or an electric field, when the positional accuracy of mounting the feeder circuit board on the radiation electrode pattern is reduced, a transmission efficiency for signal energy from the feeder circuit to the radiation electrode pattern or from the radiation electrode pattern to the feeder circuit, that is, an efficiency in transmitting signals from the radio IC chip to the radiation electrode pattern or from the radiation electrode pattern to the radio IC chip, is likely to be reduced.

SUMMARY OF THE INVENTION

To overcome the problems described above, preferred embodiments of the present invention provide a radio IC device that improves transmission efficiency for signal energy from a radio IC to a radiation electrode pattern, or from the radiation electrode pattern to the radio IC.

That is, a radio IC device according to a preferred embodiment of the present invention includes a radio IC arranged to process radio signals, an auxiliary electrode pattern that is connected to the radio IC, and a radiation electrode pattern that is coupled to the auxiliary electrode pattern and radiates the radio signals. A portion of the auxiliary electrode pattern is preferably coupled to a maximum-voltage section in the radiation electrode pattern through a capacitor.

Since a portion of the auxiliary electrode pattern is preferably capacitively coupled to a maximum-voltage section in the radiation electrode pattern, that is, in the vicinity of a location at which the nearly maximum voltage is obtained when a signal is fed to the radiation electrode pattern, a transmission efficiency for signal energy from the radio IC to the radiation electrode pattern, or from the radiation electrode pattern to the radio IC, is significantly improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a schematic plan view of a radiation electrode pattern, FIG. 1B is a schematic plan view of an auxiliary electrode pattern, FIG. 1C is a schematic plan view of an electromagnetic coupling module, and FIG. 1D is a schematic plan view of an auxiliary device.

FIG. 2A is a schematic plan view of the radio IC device, FIG. 2B is a sectional view through I-I in FIG. 2A, and FIG. 2C is a schematic sectional view of the electromagnetic coupling module.

FIG. 12A is a schematic plan view of a radiation electrode pattern, FIG. 12B is a schematic plan view of an auxiliary device, and FIG. 12C is a schematic plan view of the radio IC device.

FIG. 13A is a schematic plan view of a radiation electrode pattern, FIG. 13B is a schematic plan view of an auxiliary device, and FIG. 13C is a schematic plan view of the radio IC device.

FIG. 14A is a schematic plan view of a radiation electrode pattern, FIG. 14B is a schematic plan view of an auxiliary device, and FIG. 14C is a schematic plan view of the radio IC device.

FIG. 15A is a schematic plan view of a radiation electrode pattern, FIG. 15B is a schematic plan view of an auxiliary device, and FIG. 15C is a schematic plan view of the radio IC device.

FIG. 16A is a schematic plan view of a radiation electrode pattern, FIG. 16B is a schematic plan view of an auxiliary device, and FIG. 16C is a schematic plan view of the radio IC device.

FIG. 17A is a schematic plan view of a radiation electrode pattern, FIG. 17B is a schematic plan view of an auxiliary device, and FIG. 17C is a schematic plan view of the radio IC device.

DETAILED DESCRIPTION OF THE PREFERRED EMBODIMENTS

Figure 1A:
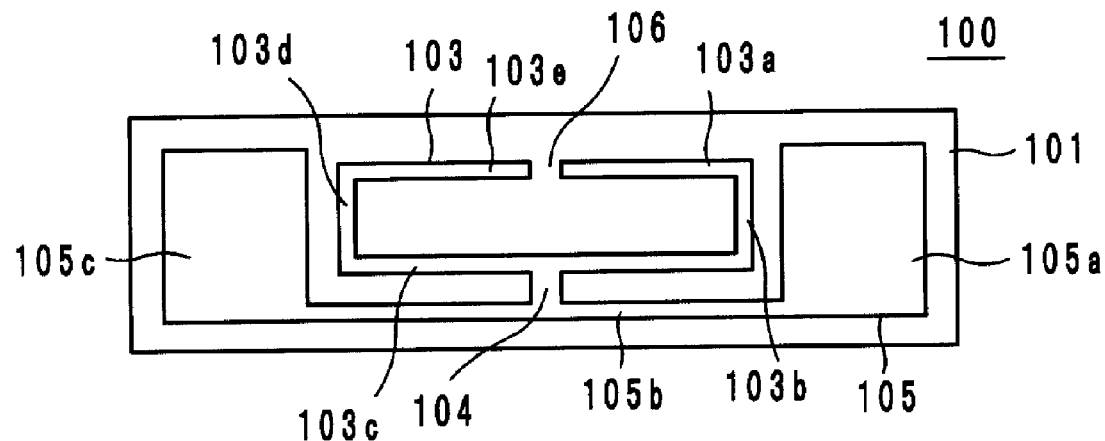
FIGS. 1A to 1D are schematic diagrams of a radio IC device according to a first preferred embodiment of the present invention.

Hereinafter, the radio IC device according to preferred embodiments of the present invention will be described. Note that, in each figure illustrating a preferred embodiment of the present invention or a modification thereof, a common reference numeral is designated to the same member or portion, and repeated description is omitted.

First Preferred Embodiment

As illustrated in FIGS. 1A to 1D and FIG. 2, a radio IC device 130 according to a first preferred embodiment of the present invention preferably includes an electromagnetic coupling module 120 including a radio IC chip 5 that processes radio signals, an auxiliary electrode pattern 110 that is connected to the electromagnetic coupling module 120, and a radiation electrode pattern 100 that is coupled to the auxiliary electrode pattern 110 and radiates radio signals.

As illustrated in FIG. 1A, the radiation electrode pattern 100 is preferably defined by a magnetic field-electric field coupling type antenna pattern in which a magnetic-field radiation electrode 103 having a loop configuration and a predetermined resonant frequency f1 and an electric-field radiation electrode 105 having a dipole configuration and a predetermined resonant frequency f2 are coupled to each other through a coupling section 104, for example. The magnetic-field radiation electrode 103 and the electric-field radiation electrode 105 are preferably formed by patterning a metallic material into a predetermined shape on a second supporting body 101.

The magnetic-field radiation electrode 103 is preferably formed into a loop configuration by connecting a straight section 103a, a straight section 103b, a straight section 103c, a straight section 103d, and a straight section 103e in a circular pattern, for example. An opening-side end portion of the straight section 103a and an opening-side end portion of the straight section 103e preferably face each other with a predetermined space 106 therebetween. Furthermore, the electric-field radiation electrode 105 preferably formed into a dipole configuration by connecting a large-width section 105a, a straight section 105b, and a large-width section 105c in a linear pattern, for example.

In this case, preferably the resonant frequency f1 of the magnetic-field radiation electrode 103 differs from the resonant frequency f2 of the electric-field radiation electrode 105. That is, when the resonant frequency f1 and the resonant frequency f2 are different from each other (f1≠f2), and the magnetic-field radiation electrode 103 and the electric-field radiation electrode 105 are coupled to each other, a frequency characteristic of the radiation electrode pattern 100 can be set to have a wider bandwidth. Note that the coupling of the magnetic-field radiation electrode 103 to the electric-field radiation electrode 105 may be achieved by direct electrical coupling or coupling through a magnetic field or an electric field. Note that the magnetic-field radiation electrode 103 and the electric-field radiation electrode 105, which define the radiation electrode pattern 100, are preferably antenna patterns that resonate near the frequency of the radio signals. Preferably, the magnetic-field radiation electrode 103 is a radiation electrode that primarily uses a magnetic field to transmit and receive the radio signals, and an electrical length L1 thereof (the electrical length from one end of the loop-shaped magnetic-field radiation electrode 103 to the other end) corresponds to a wavelength λ1 in the resonant frequency f1 (L1=λ1). Furthermore, preferably, the electric-field radiation electrode 105 is a radiation electrode that primarily uses an electric field to transmit and receive the radio signals, and is designed so that an electrical length L2 thereof (the electrical length from one end of the dipole-configuration electric-field radiation electrode 105 to the other end) corresponds to one half of a wavelength λ2 in the resonant frequency f2 (L2=λ2/2).

Figure 1B:
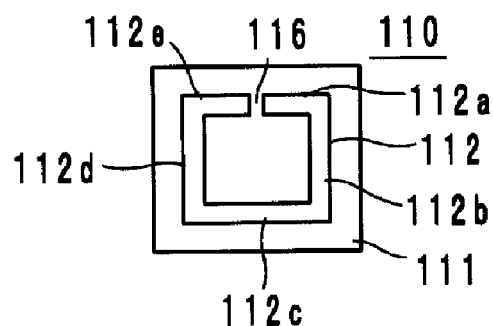

As illustrated in FIG. 1B, the auxiliary electrode pattern 110 preferably includes a loop-shaped electrode 112 that is patterned with the metallic material provided on a first supporting body 111. In addition, the loop-shaped electrode 112 is preferably formed into a loop configuration by connecting a straight section 112a, a straight section 112b, a straight section 112c, a straight section 112d, and a straight section 112e in a circular pattern. An opening-side end portion of the straight section 112a and an opening-side end portion of the straight section 112e preferably face each other with a predetermined space 116 therebetween.

Note that the first supporting body that defines the auxiliary electrode pattern and the second supporting body that defines the radiation electrode pattern may preferably be a flexible board, such as a PET film, for example, instead of a rigid board, such as a printed wiring board, for example. Similarly, the loop-shaped electrode that defines the auxiliary electrode pattern, the magnetic-field radiation electrode that defines the radiation electrode pattern, and the electric-field radiation electrode itself may preferably be made of a flexible material, such as a metallic foil, for example, instead of a rigid material, such as a sintered metal or a metallic plate, for example. In view of the application to various articles, the first supporting body and the second supporting body are preferably a flexible sheet, such as a PET film, for example.

Figure 1C:
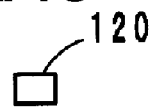
Figure 1D:
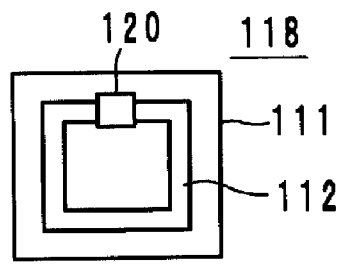

Furthermore, the electromagnetic coupling module 120 illustrated in FIG. 1C is preferably disposed near an opening-side end portion of the straight section 112a and an opening-side end portion of the straight section 112e of the loop-shaped electrode 112, that is, near the end portions facing each other with the space 116 therebetween, to define an auxiliary device 118. That is, the auxiliary device 118 includes the loop-shaped electrode 112 provided on the first supporting body 111 and the electromagnetic coupling module 120 mounted at the predetermined position.

Figure 2A:
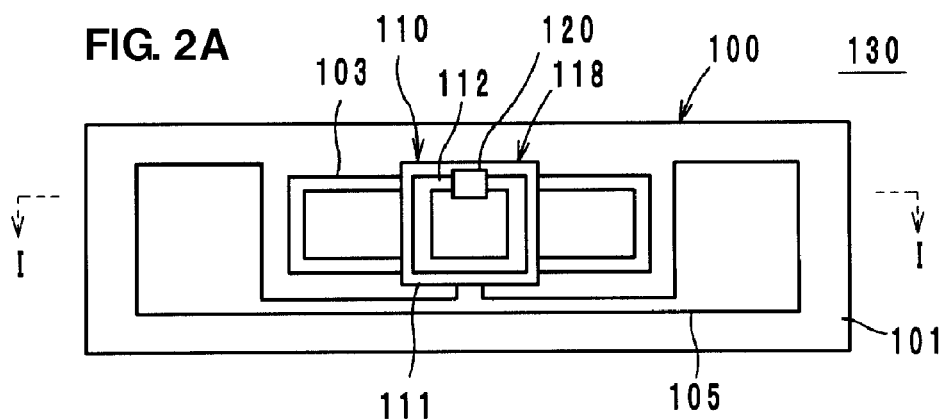
FIGS. 2A to 2C are schematic diagrams of the radio IC device according to the first preferred embodiment.
Figure 2B:
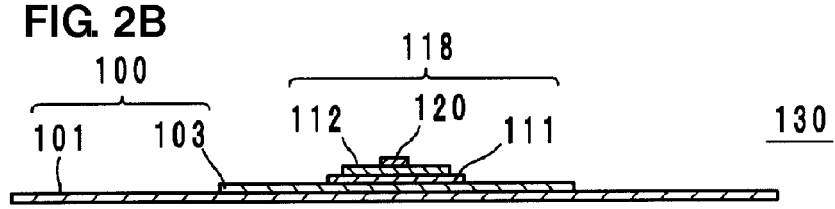

In addition, as illustrated in FIG. 2A, the auxiliary device 118 is preferably attached to the radiation electrode pattern 100 so that a portion of the loop-shaped electrode 112 in the auxiliary electrode pattern 110 is coupled to a maximum-voltage section in the radiation electrode pattern 100 through a capacitor. That is, the first supporting body 111 is preferably attached to the second supporting body 101 so that a portion of the loop-shaped electrode 112 is capacitively coupled to a maximum-voltage section in the magnetic-field radiation electrode 103. To be specific, the auxiliary device 118 and the radiation electrode pattern 100 are preferably capacitively coupled to each other near a point (a maximum-voltage point), on the radiation electrode pattern 100, at which a substantially maximum voltage is obtained when radio signals are fed. That is, the straight section 112a and the straight section 112e of the loop-shaped electrode 112 are preferably respectively capacitively coupled to the straight section 103a and the straight section 103e of the magnetic-field radiation electrode 103. In this case, the straight section 103a and the straight section 103e of the magnetic-field radiation electrode 103 are in the vicinity (portions facing each other with the space 106 therebetween) of the opening end portions of the magnetic-field radiation electrode 103 and are in the region where a substantially maximum voltage is obtained when radio signals are fed. Thus, when the auxiliary electrode pattern 110 and the radiation electrode pattern 101 are capacitively coupled in this region, the transmission efficiency for signal energy from the radio IC chip 5 to the radiation electrode pattern 101, or from the radiation electrode pattern 101 to the radio IC chip 5 is significantly improved.

In the first preferred embodiment, the loop-shaped electrode 112 of the auxiliary electrode pattern 110 is preferably arranged so as to electrically extend to both of the magnetic-field radiation electrode 103 and the electric-field radiation electrode 105. As described above, the loop-shaped electrode 112 is preferably arranged so that the straight section 112a and the straight section 112e thereof are respectively capacitively coupled to the straight section 103a and the straight section 103e of the magnetic-field radiation electrode 103. Furthermore, the straight section 112c of the loop-shaped electrode 112 is preferably arranged so as to be coupled to the straight section 103c of the magnetic-field radiation electrode 103 through a magnetic field. In addition, the straight section 103c of the magnetic-field radiation electrode 103 is preferably coupled to the straight section 105b of the electric-field radiation electrode 105 through the coupling section 104, and the current value in the straight section 103c of the magnetic-field radiation electrode 103 is preferably substantially equal to the current value at the center portion of the electric-field radiation electrode 105. Therefore, in the first preferred embodiment, the loop-shaped electrode 112 of the auxiliary electrode pattern 110 is preferably arranged so as to electrically extend to both of the magnetic-field radiation electrode 103 and the electric-field radiation electrode 105.

Furthermore, the loop-shaped electrode 112 of the auxiliary electrode pattern 110 preferably includes a portion (maximum-current section) at which a maximum current value is obtained and a portion (maximum-voltage section) at which a maximum voltage value is obtained when the radio signals are fed. That is, an area in the vicinity of the opening end portions of the loop-shaped electrode 112 (an area in the vicinity of the straight section 112a and the straight section 112e) becomes a maximum-voltage section, and the portion that faces thereto, that is, the straight section 112c, becomes a maximum-current section.

On the other hand, the magnetic-field radiation electrode 103 also preferably includes a portion (maximum-voltage section) at which a maximum voltage value is obtained when the radio signals are fed, and the electric-field radiation electrode 105 also includes a portion (maximum-current section) at which a maximum current value is obtained when the radio signals are fed. That is, in the magnetic-field radiation electrode 103, an area where the portions face each other across the space 106, that is, an area in the vicinity of the straight section 103a and the straight section 103e, becomes the maximum-voltage section, and the portion that faces the space 106, that is, an area in the vicinity of the straight section 103c, becomes the maximum-current section. In addition, in the electric-field radiation electrode 105, an area in the vicinity of both end portions (the large-width section 105a and the large-width section 105c) thereof becomes the maximum-voltage section and an area in the vicinity of the center portion (the straight section 105b) thereof becomes the maximum-current section.

In the first preferred embodiment, the portion in the magnetic-field radiation electrode 103, which is coupled to the electric-field radiation electrode 105, preferably has a current value substantially equal to that at the maximum-current section of the electric-field radiation electrode 105. Thus, the maximum-current section of the loop-shaped electrode 112 that defines the auxiliary electrode pattern 110 is preferably coupled to the maximum-current section of the electric-field radiation electrode 105 through a magnetic field, and the maximum-voltage section of the loop-shaped electrode 112 that defines the auxiliary electrode pattern 110 is preferably capacitively coupled to the maximum-voltage section of the magnetic-field radiation electrode 103. As a result, the energy transmission efficiency for signals is significantly improved, and thus, even when the mounting position of the auxiliary device 118 on the radiation electrode pattern 100 varies, sufficient signal energy can still be transmitted.

Figure 2C:
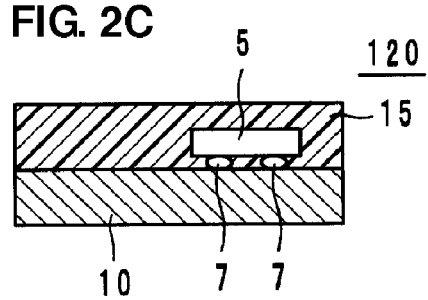

As illustrated in FIG. 2C, preferably, the electromagnetic coupling module 120 is arranged such that the radio IC chip 5 is mounted on a feeder circuit board 10 that includes a feeder circuit including at least one coil pattern with a bonding agent 7 such as solder, for example, therebetween, and the radio IC chip 5 is sealed with a sealing member 15, such as resin, for example.

Figure 3:
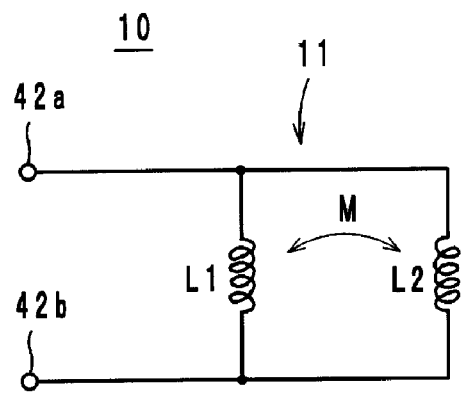
FIG. 3 is an equivalent circuit illustrating a feeder circuit of the radio IC device according to the first preferred embodiment of the present invention.

As illustrated as an equivalent circuit in FIG. 3, the feeder circuit board 10 preferably includes a feeder circuit 11 that includes a resonant circuit/matching circuit including inductance elements L1 and L2 having inductance values that are different from each other and being magnetically coupled to each other with opposite phases (indicated by mutual inductance M).

Figure 4:
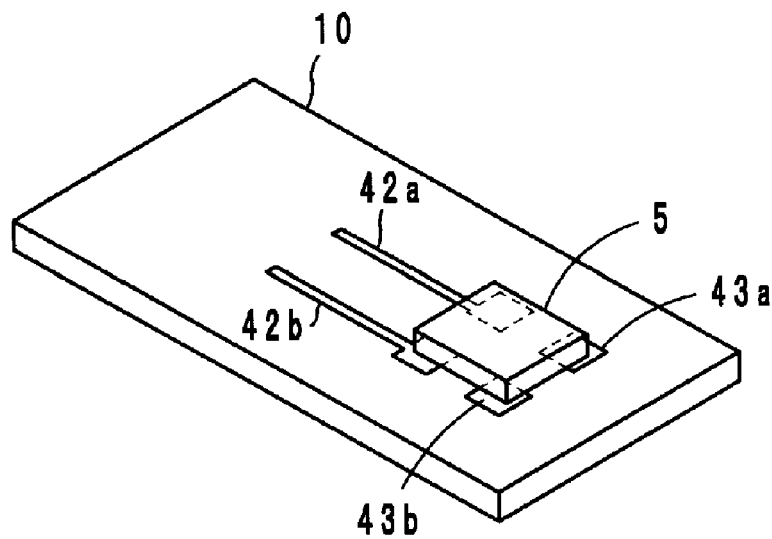
FIG. 4 is a schematic perspective view illustrating the electromagnetic coupling module of the radio IC device according to the first preferred embodiment of the present invention.

The radio IC chip 5 preferably includes a clock circuit, a logic circuit, a memory circuit and other suitable circuit elements, and stores necessary information therein. At the bottom surface of the radio IC chip 5, a pair of input/output terminal electrodes (not shown) and a pair of mounting terminal electrodes (not shown) are preferably provided. As illustrated in FIG. 4, preferably, the input/output terminal electrodes are electrically connected to feeder terminal electrodes 42a and 42b provided on the feeder circuit board 10, with a metallic bump, for example, therebetween, and the mounting terminal electrodes are electrically connected to mounting electrodes 43a and 43b with a metallic bump, for example, therebetween. Note that the radio IC chip may be integrally formed with the auxiliary electrode pattern 110, instead of being formed into a chip shape.

Preferably, the inductance elements L1 and L2 included in the feeder circuit 11 are magnetically coupled to each other in an opposite phase and resonate at the frequency of signals that the radio IC chip 5 processes. In addition, the electromagnetic coupling module 120 is preferably mounted at a predetermined position on the auxiliary electrode pattern 110 with an adhesive or other bonding material therebetween, and the feeder circuit 11 is preferably coupled to the opening end portion of the straight section 112a and the opening end portion of the straight section 112e in the loop-shaped electrode 112 of the auxiliary electrode pattern 110 through an electromagnetic field. It is preferable to configure the feeder circuit 11 so as to provide matching between the impedance (typically about 50Ω) of the radio IC chip 5 and the impedance (space impedance about 377Ω) of the radiation electrode pattern 100.

Therefore, the feeder circuit 11 transmits a transmission signal having a predetermined frequency transmitted from the radio IC chip 5 to the radiation electrode pattern 100 through the auxiliary electrode pattern 110, selects a reception signal having a predetermined frequency from signals which have been received by the radiation electrode pattern 100 and passed through the auxiliary electrode pattern 110, and supplies the selected signal to the radio IC chip 5. Consequently, in the radio IC device 130, the radio IC chip 5 is operated by a signal received by the radiation electrode pattern 100, and a response signal from the radio IC chip 5 is radiated outside from the radiation electrode pattern 100.

The magnetic-field radiation electrode 103 that defines the radiation electrode pattern 100 preferably has a predetermined length from the opening end portion of the straight section 103a to the opening end portion of the straight section 103e, and a predetermined resonant frequency that corresponds to this electrical length. Similarly, the electric-field radiation electrode 105 preferably has a predetermined resonant frequency that corresponds to the electrical length. In this case, with the resonant frequency of the magnetic-field radiation electrode 103 being f1 and the resonant frequency of the electric-field radiation electrode 105 being f2, it is preferable to design the magnetic-field radiation electrode 103 so that f1 has a resonant frequency less than f2. That is, when the magnetic-field radiation electrode 103 and the electric-field radiation electrode 105 are viewed separately, it is preferable to design the magnetic-field radiation electrode 103 so that the electrical length thereof is equal to or greater than the electrical length of the electric-field radiation electrode 105.

Furthermore, in the first preferred embodiment, the magnetic-field radiation electrode 103 and the electric-field radiation electrode 105 are preferably connected through the coupling section 104 so as to enable electrical conduction therebetween. Preferably, the connection section between the magnetic-field radiation electrode 103 and the electric-field radiation electrode 105 is a point at which the current flowing through the magnetic-field radiation electrode 103 and the current flowing through the electric-field radiation electrode 105 have a maximum value. Therefore, a signal transmitted from the electromagnetic coupling module 120 propagates through the magnetic-field radiation electrode 103 and is transmitted to the electric-field radiation electrode 105. By using a point at which the currents of both electrodes have a maximum value as a connection point, the coupling of both of the electrodes is improved to a greater degree, whereby the transmission efficiency for signals is further improved.

Then, from the magnetic-field radiation electrode 103, a portion of the signal is radiated as a magnetic field to the outside of the radio IC device 130. Also from the electric-field radiation electrode 105, a signal is radiated as an electric field to the outside.

Figure 5:
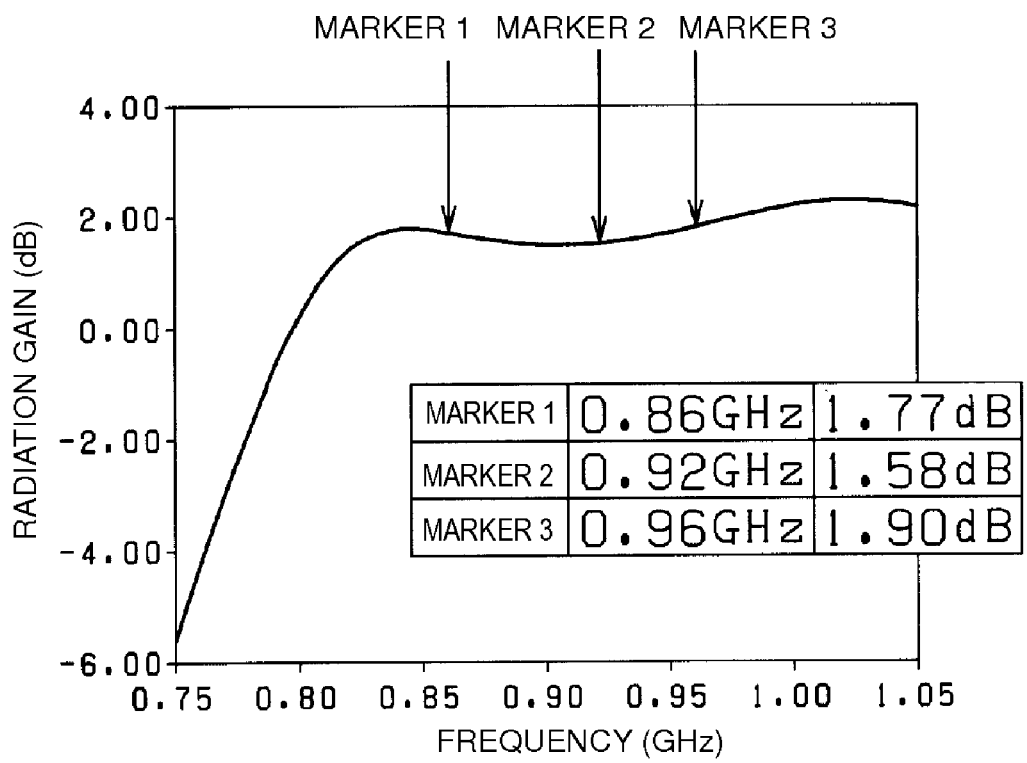
FIG. 5 is a graph illustrating a frequency characteristic of radiation gain of the radio IC device according to the first preferred embodiment of the present invention.

FIG. 5 illustrates a frequency characteristic of radiation gain of the radio IC device 130 according to the first preferred embodiment. FIG. 5 clearly shows that a high radiation gain of about 1.5 dB or greater is obtained across a wide frequency band of about 100 MHz between the resonant frequency caused by the magnetic-field radiation electrode 103 and the resonant frequency caused by the electric-field radiation electrode 105 in the state in which the magnetic-field radiation electrode 103 and the electric-field radiation electrode 105 are coupled to each other. Note that a marker 1 and a marker 2 in FIG. 5 respectively indicate the upper limit and the lower limit of frequencies to be used in RFID in the UHF band.

Furthermore, with the frequency of a signal that the magnetic-field radiation electrode 103 transmits and receives being f0, a sufficient radiation gain is obtained in a predetermined signal frequency f0 by setting the frequency f0 to a value between the frequency f1' (about 0.86 GHz) of the marker 1 and the frequency f2' (about 0.96 GHz) of the marker 2. In addition, even when there are some variations in the frequencies f1' and f2' due to variations in the manufacturing of the magnetic-field radiation electrode 103 and the electric-field radiation electrode 105, the radio IC device can be operated without any problems at a frequency between the two frequencies f1' and f2', whereby the reliability of the radio IC device is significantly improved.

The magnetic-field radiation electrode 103 and the electric-field radiation electrode 105 are preferably connected with each other through the coupling section 104, and thus, when the magnetic-field radiation electrode 103 and the electric-field radiation electrode 105 are coupled to each other, the resonant frequency f2 of the radiation electrode pattern 100 becomes less than the design value provided for the electric-field radiation electrode 105 alone. Therefore, it is preferable to design the resonant frequency f1 of the magnetic-field radiation electrode 103 alone to be less than the resonant frequency f2 of the electric-field radiation electrode 105. This enables the radio IC device 130 to have a sufficient radiation characteristic in a band of the frequencies f1' and f2'. In addition, it is preferable to design the resonant frequency f1 of the magnetic-field radiation electrode 103 alone to be greater than the resonant frequency of the resonant circuit in the feeder circuit 11. As described above, when the magnetic-field radiation electrode 103 is coupled to the electric-field radiation electrode 105, the resonant frequency f1 of the magnetic-field radiation electrode 103 becomes relatively low. Therefore, when the resonant frequency f1 of the magnetic-field radiation electrode 103 alone is designed to be greater than the resonant frequency f0 of the resonant circuit, the resonant frequency f0 can be set to be in the band of the frequencies f1' and f2' while the magnetic-field radiation electrode 103 is operating, that is, in the state in which the magnetic-field radiation electrode 103 and the electric-field radiation electrode 105 are coupled to each other. Thus, stable communication with a high radiation gain is achieved. Note that the resonant frequency f2 of the electric-field radiation electrode 105 is preferably less than about $\lambda/2$ with respect to the wavelength $\lambda$ of the signal, for example.

As described above, in the radio IC device 130, the feeder circuit 11 provided on the feeder circuit board 10 preferably sets a resonant frequency for the signal, and the resonant frequency is preferably located between the resonant frequency of the magnetic-field radiation electrode 103 and the resonant frequency of the electric-field radiation electrode 105. Therefore, the radio IC device 130 operates properly even when the radio IC device 130 is attached to various articles, and variations in the radiation characteristic are minimized or prevented. Thus, the design of the radiation electrode pattern 100 does not need to be changed for each individual article. Furthermore, the frequency of a transmission signal radiated from the radiation electrode pattern 100 and the frequency of a reception signal supplied to the radio IC chip 5 preferably substantially correspond to the resonant frequency of the feeder circuit 11 in the feeder circuit board 10. Since the frequency of the transmission/reception signal is determined in the feeder circuit board 10, a stable frequency characteristic is obtained, without changing the frequency characteristic, independently of the shape, size, arrangement relationship, and other parameters of the magnetic-field radiation electrode 103 and the electric-field radiation electrode 105, for example, even when the radio IC device 130 is curved or disposed between dielectrics.

Note that the degree of coupling between the magnetic-field radiation electrode 103 and the electric-field radiation electrode 105 in the coupling section 104 is affected by the width of the electrodes and the space therebetween in the coupling section 104. That is, as the width and the space increase, the degree of coupling decreases.

Figure 6:
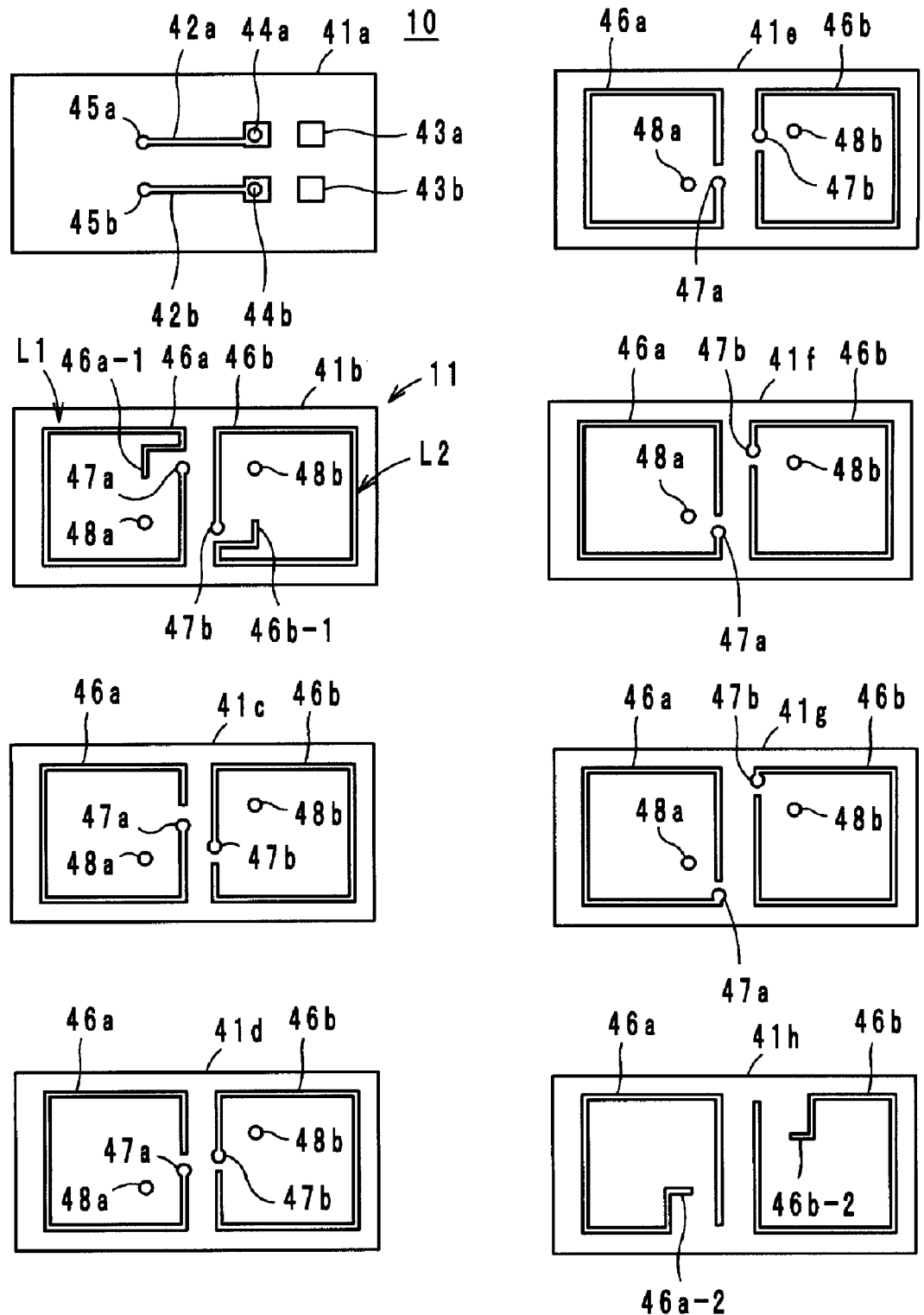
FIG. 6 is an exploded plan view illustrating a layered structure of the feeder circuit board of the radio IC device according to the first preferred embodiment of the present invention.

Next, a configuration of the feeder circuit board 10 will be described with reference to FIG. 6. The feeder circuit board 10 is preferably formed by laminating, press-bonding, and firing ceramic sheets 41a to 41h made of a dielectric material or a magnetic material, for example. However, an insulation layer that defines the feeder circuit board 10 is not limited to a ceramic sheet, and may be made of, for example, a resin sheet such as a thermosetting resin or a thermoplastic resin. On the uppermost-layer sheet 41a, the feeder terminal electrodes 42a and 42b, the mounting electrodes 43a and 43b, and via-hole conductors 44a, 44b, 45a and 45b are provided. On each of the second- to eighth-layer sheets 41b to 41h, wiring electrodes 46a and 46b that respectively define inductance elements L1 and L2 are provided, and via-hole conductors 47a, 47b, 48a, and 48b are provided as required.

By stacking the above-mentioned sheets 41a to 41h, preferably the inductance element L1 in which the wiring electrode 46a is connected in a spiral shape in the via-hole conductor 47a is provided and the inductance element L2 in which the wiring electrode 46b is connected in a spiral shape in the via-hole conductor 47b is provided. In addition, a capacitance is preferably provided between the wiring electrodes 46a and 46b.

Preferably, an end portion 46a-1 of the wiring electrode 46a on the sheet 41b is connected to the feeder terminal electrode 42a through the via-hole conductor 45a, and an end portion 46a-2 of the wiring electrode 46a on the sheet 41h is connected to the feeder terminal electrode 42b through the via-hole conductors 48a and 45b. An end portion 46b-1 of the wiring electrode 46b on the sheet 41b is connected to the feeder terminal electrode 42b through the via-hole conductor 44b, and an end portion 46b-2 of the wiring electrode 46b on the sheet 41h is connected to the feeder terminal electrode 42a through the via-hole conductors 48b and 44a.

In the above-described feeder circuit 11, since the inductance elements L1 and L2 are wound in opposite directions, magnetic fields generated in the inductance elements L1 and L2 cancel each other out. Since the magnetic fields are cancelled out, it is necessary to increase the length of the wiring electrodes 46a and 46b to some extent in order to obtain desired inductance values. This increase in the length reduces the Q value, and thus, the steepness of the resonant characteristic is lost, whereby a wider bandwidth can be obtained near the resonant frequency.

The inductance elements L1 and L2 are preferably arranged so as to be respectively located at different positions in the left and right sides, when the feeder circuit board 10 is viewed in perspective plan view. In addition, the magnetic fields generated in the inductance elements L1 and L2 are preferably in directions opposite to each other. With this configuration, when the feeder circuit 11 is coupled to the straight section 103a and the straight section 103e of the magnetic-field radiation electrode 103, currents having opposite directions are excited in the straight section 103a and the straight section 103e, whereby the magnetic-field radiation electrode 103 can transmit/receive a signal to the electric-field radiation electrode 105.

Note that, in the first preferred embodiment, the mounting position of the auxiliary device 118 on the radiation electrode pattern 100 is not limited to the position indicated in FIG. 2A.

Figure 7:
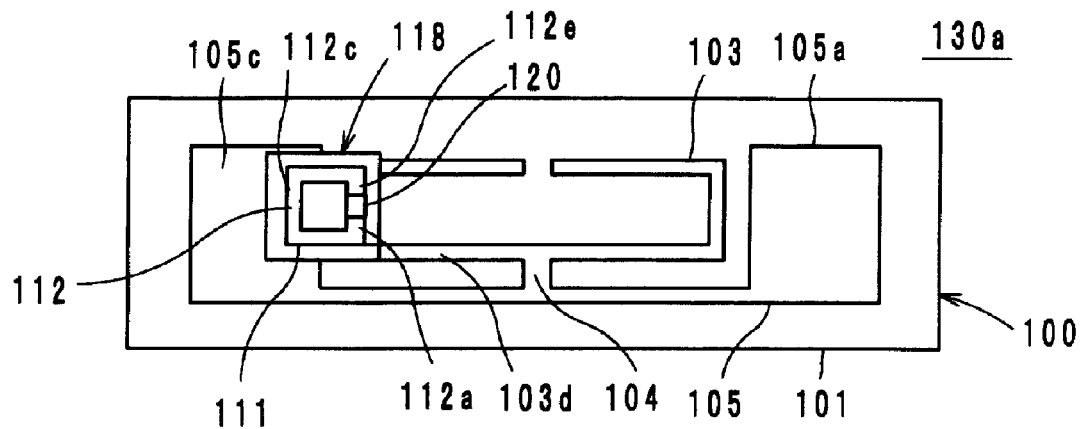
FIG. 7 is a schematic plan view illustrating one modification of the radio IC device according to the first preferred embodiment of the present invention.

For example, as illustrated in FIG. 7, in a radio IC device 130a, the auxiliary device 118, which the electromagnetic coupling module 120 coupled to the loop-shaped electrode 112, may preferably be arranged so as to extend to the straight section 103d of the magnetic-field radiation electrode 103, which defines the radiation electrode pattern 100, and to the large-width section 105c of the electric-field radiation electrode 105. In this case, the straight section 112c of the loop-shaped electrode 112 is capacitively coupled to the large-width section 105c, which is a maximum electric-field section in the electric-field radiation electrode 105, and the straight section 112a and the straight section 112e of the loop-shaped electrode 112 are coupled to the straight section 103d of the magnetic-field radiation electrode 103 through an electric field and a magnetic field.

Figure 8:
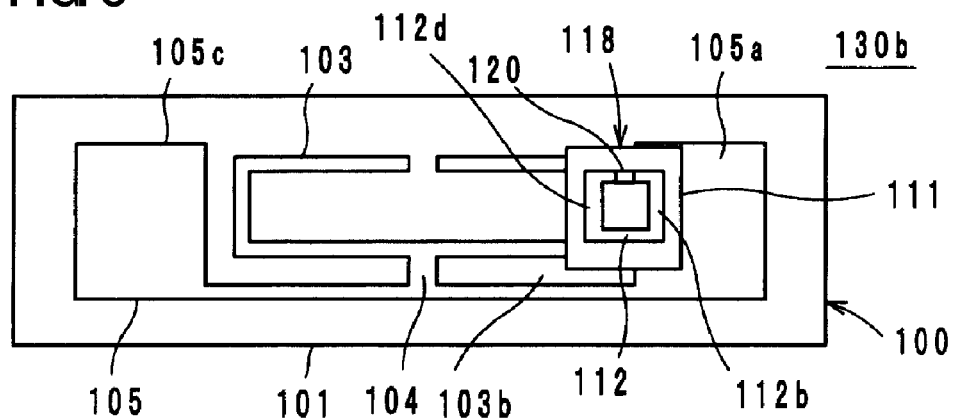
FIG. 8 is a schematic plan view illustrating another modification of the radio IC device according to the first preferred embodiment of the present invention.

In addition, as illustrated in FIG. 8, in a radio IC device 130b, the auxiliary device 118, which includes the electromagnetic coupling module 120 coupled to the loop-shaped electrode 112, may preferably be arranged so as to extend to the straight section 103b of the magnetic-field radiation electrode 103, which defines the radiation electrode pattern 100, and to the large-width section 105a of the electric-field radiation electrode 105. In this case, the straight section 112b of the loop-shaped electrode 112 is capacitively coupled to the large-width section 105a, which is a maximum electric-field section in the electric-field radiation electrode 105, and the straight section 112d of the loop-shaped electrode 112 is coupled to the straight section 103b of the magnetic-field radiation electrode 103 through an electric field and a magnetic field.

Figure 9:
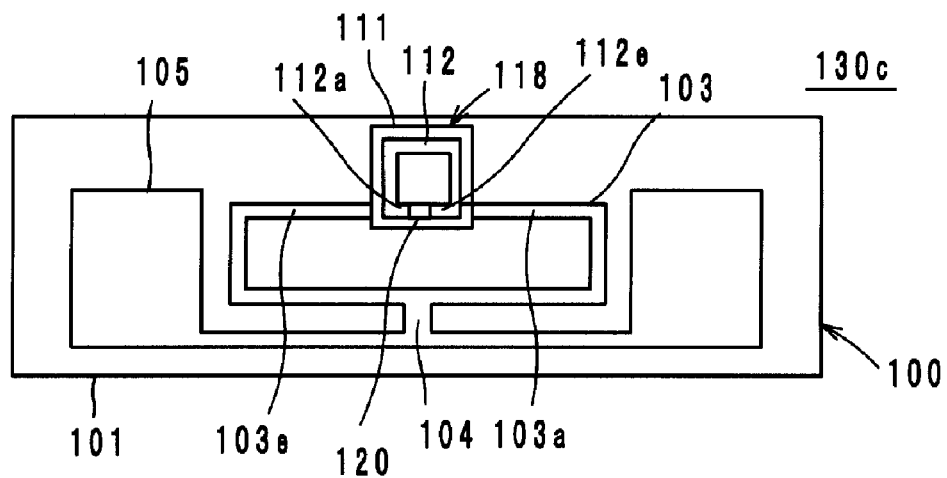
FIG. 9 is a schematic plan view illustrating still another modification of the radio IC device according to the first preferred embodiment of the present invention.

In addition, as illustrated in FIG. 9, in a radio IC device 130c, the auxiliary device 118, which includes the electromagnetic coupling module 120 coupled to the loop-shaped electrode 112, may be arranged in the radiation electrode pattern 100 so that the straight section 112a and the straight section 112e of the loop-shaped electrode 112 are capacitively coupled to the straight sections 103a and 103e, which are maximum electric-field sections in the magnetic-field radiation electrode 103 constituting the radiation electrode pattern 100.

Second Preferred Embodiment

Figure 10:
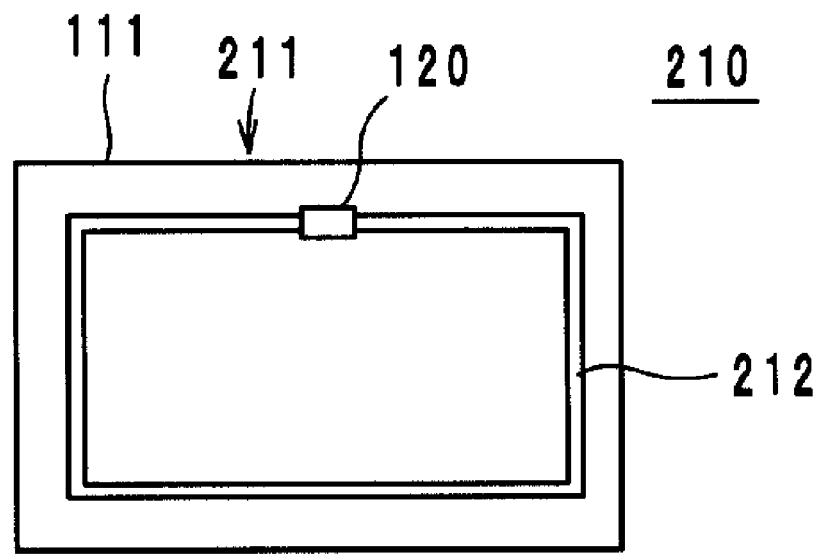
FIG. 10 is a schematic plan view of an auxiliary device of a radio IC device according to a second preferred embodiment of the present invention.

As illustrated in FIG. 10, an auxiliary device 210 according to the second preferred embodiment of the present invention is different from the auxiliary device 118 in the first preferred embodiment in that the shape of a loop-shaped electrode 212 that defines an auxiliary electrode pattern 211 is different. That is, the shape of the loop-shaped electrode 212 is not limited to a square shape, and may preferably be a horizontally elongated substantially rectangular shape as in this second preferred embodiment. In addition, the shape of the loop-shaped electrode 212 may preferably be a vertically elongated substantially rectangular shape, a substantially rhomboid shape, a substantially circular shape, or a substantially elliptic shape, for example.

Third Preferred Embodiment

Figure 11:
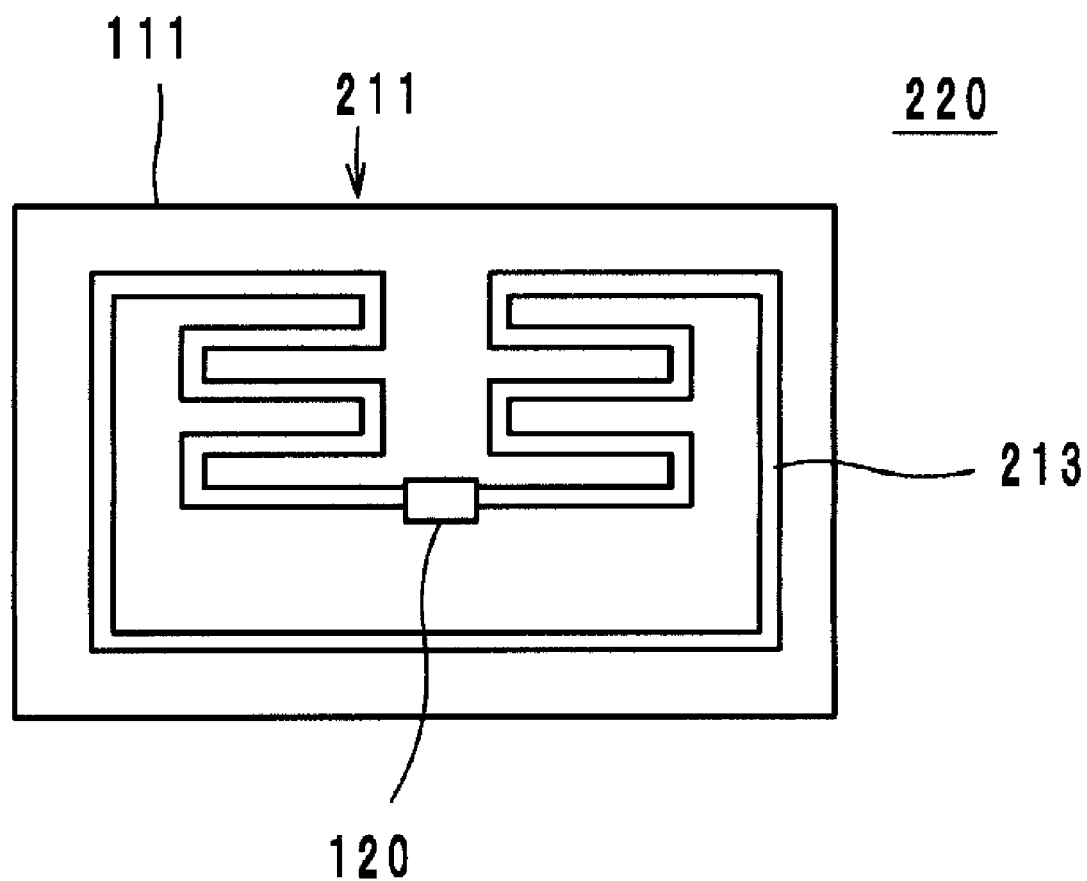
FIG. 11 is a schematic plan view of an auxiliary device of a radio IC device according to a third preferred embodiment of the present invention.

As illustrated in FIG. 11, an auxiliary device 220 according to the third preferred embodiment of the present invention is different from the auxiliary device 118 in the first preferred embodiment in that the shape of a loop-shaped electrode 213 that defines an auxiliary electrode pattern 211 is different. That is, the shape of the loop-shaped electrode 213 may preferably include a portion thereof that has a meandering shape as in this third preferred embodiment. Note that a capacitor or a resistor may preferably be inserted in series or in parallel into a portion of the loop-shaped electrode. In addition, the loop-shaped electrode may preferably include a layered structure in which coil electrodes are laminated.

Fourth Preferred Embodiment

Figure 12A:
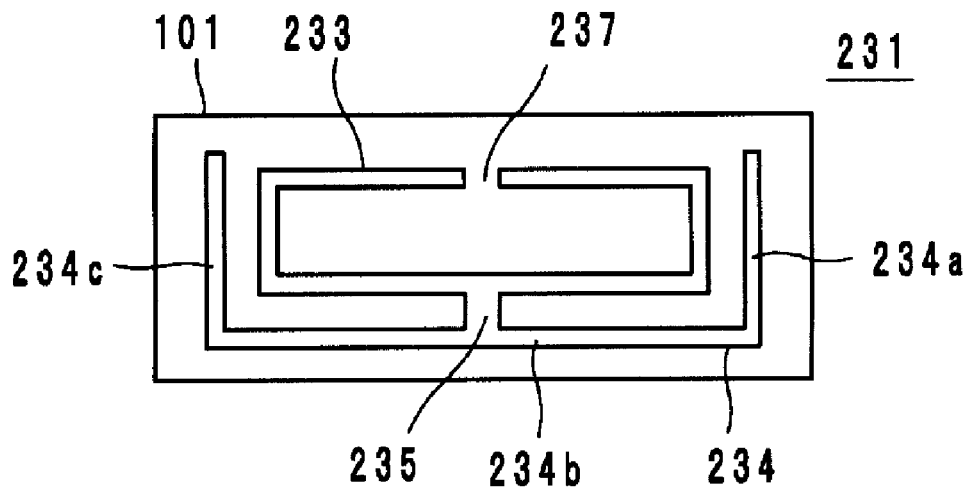
FIGS. 12A to 12C are schematic diagrams of a radio IC device according to a fourth preferred embodiment of the present invention.
Figure 12B:
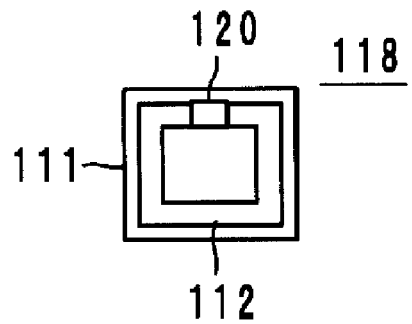
Figure 12C:
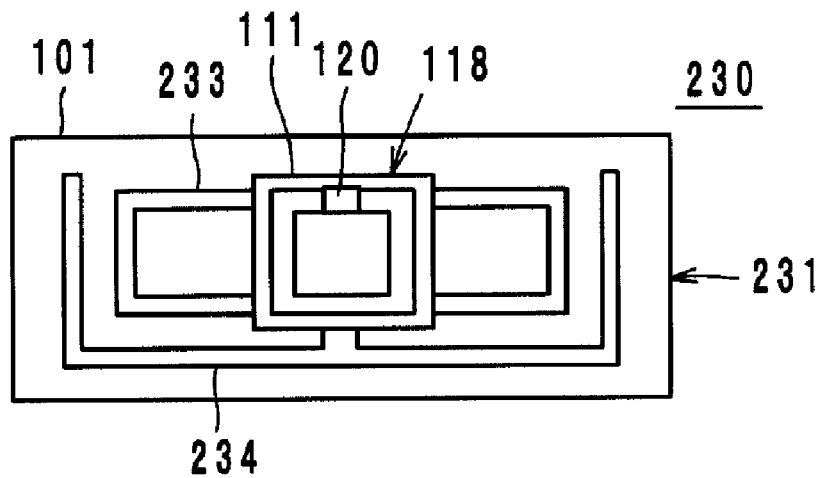

As illustrated in FIGS. 12A to 12C, a radio IC device 230 according to the fourth preferred embodiment of the present invention preferably includes the auxiliary device 118, which includes the electromagnetic coupling module 120 coupled to the loop-shaped electrode 112, mounted on a radiation electrode pattern 231, which is defined by coupling a magnetic-field radiation electrode 233 and an electric-field radiation electrode 234 to each other through a coupling section 235. As in the fourth preferred embodiment, the electric-field radiation electrode 234 may preferably include a straight section 234a, a straight section 234b, and a straight section 234c each having a substantially same width, and may have a bent structure in which the straight section 234a and the straight section 234c are arranged at about 90 degrees with respect to the straight section 234b.

Fifth Preferred Embodiment

Figure 13A:
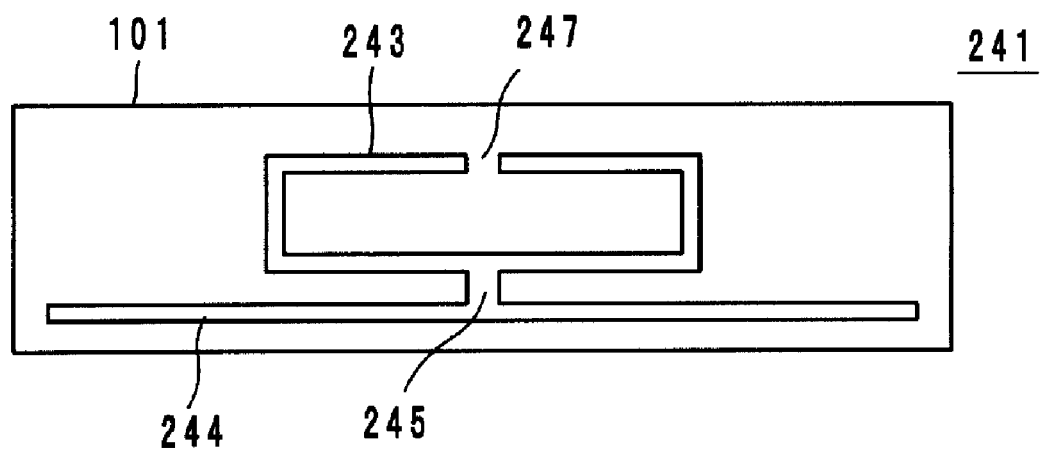
FIGS. 13A to 13C are schematic diagrams of a radio IC device according to a fifth preferred embodiment of the present invention.
Figure 13B:
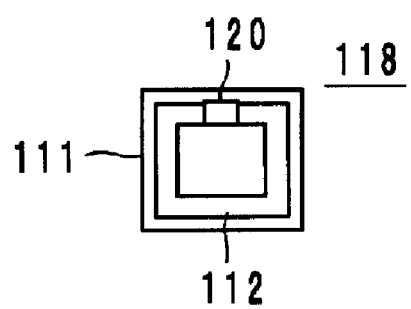
Figure 13C:
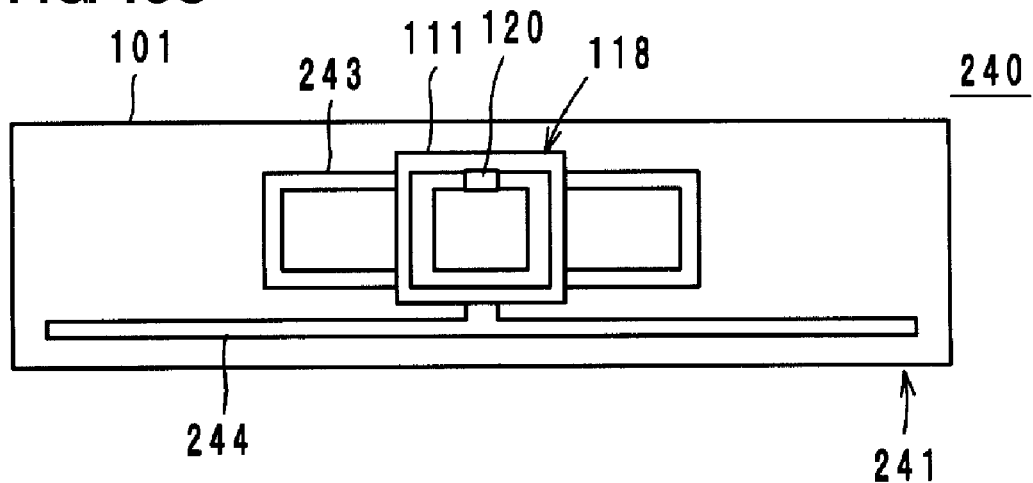

As illustrated in FIGS. 13A to 13C, a radio IC device 240 according to the fifth preferred embodiment of the present invention preferably includes the auxiliary device 118, which includes the electromagnetic coupling module 120 coupled to the loop-shaped electrode 112, mounted on a radiation electrode pattern 241, which is defined by coupling a magnetic-field radiation electrode 243 and an electric-field radiation electrode 244 to each other through a coupling section 245. As in the fifth preferred embodiment, the electric-field radiation electrode 244 may preferably be a straight electrode having a substantially uniform width.

Sixth Preferred Embodiment

Figure 14A:
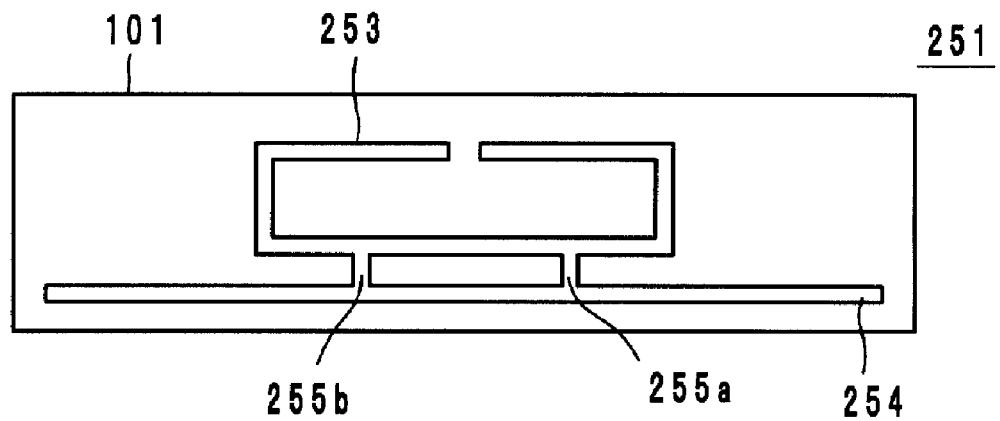
FIGS. 14A to 14C are schematic diagrams of a radio IC device according to a sixth preferred embodiment.
Figure 14B:
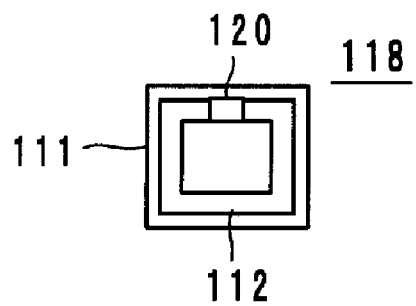
Figure 14C:
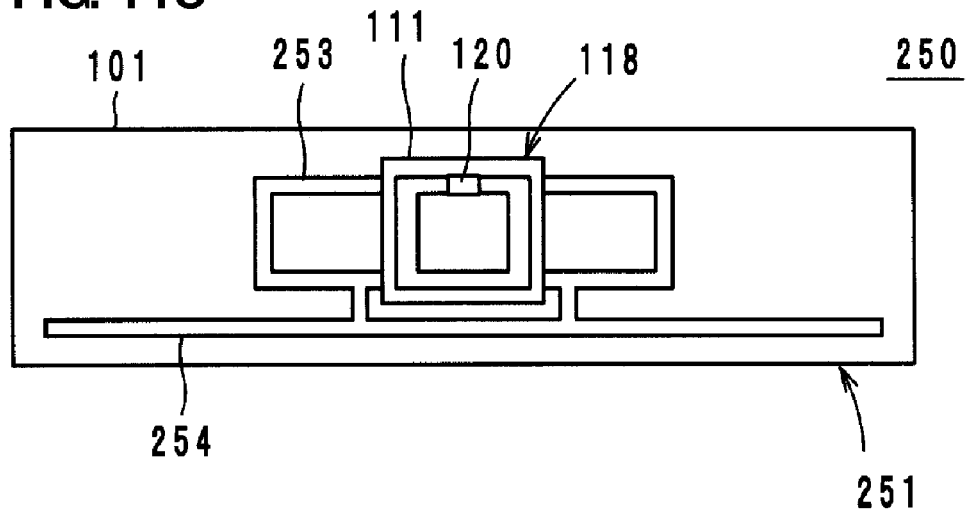

As illustrated in FIGS. 14A to 14C, a radio IC device 250 of the sixth preferred embodiment of the present invention preferably includes the auxiliary device 118, which includes the electromagnetic coupling module 120 coupled to the loop-shaped electrode 112, mounted on a radiation electrode pattern 251, which is defined by coupling a magnetic-field radiation electrode 253 and an electric-field radiation electrode 254 to each other through two coupling sections 255a and 255b. In this manner, a coupling section arranged to couple the magnetic-field radiation electrode 253 and the electric-field radiation electrode 254 to each other is provided at more than one location.

Seventh Preferred Embodiment

Figure 15A:
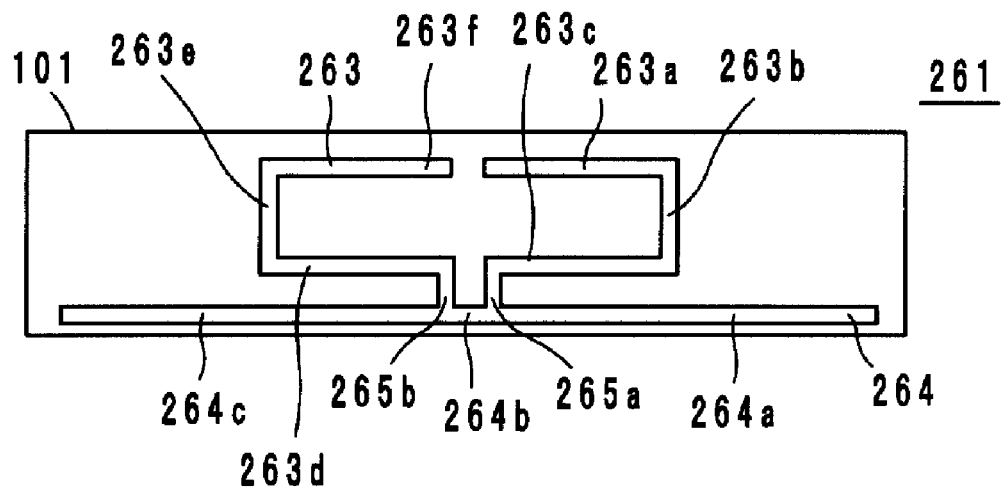
FIGS. 15A to 15C are schematic diagrams of a radio IC device according to a seventh preferred embodiment of the present invention.
Figure 15B:
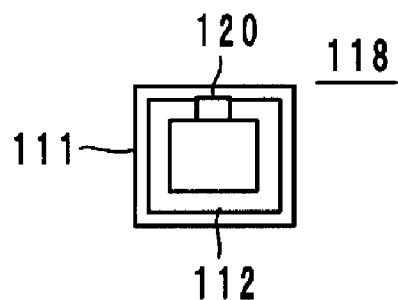
Figure 15C:
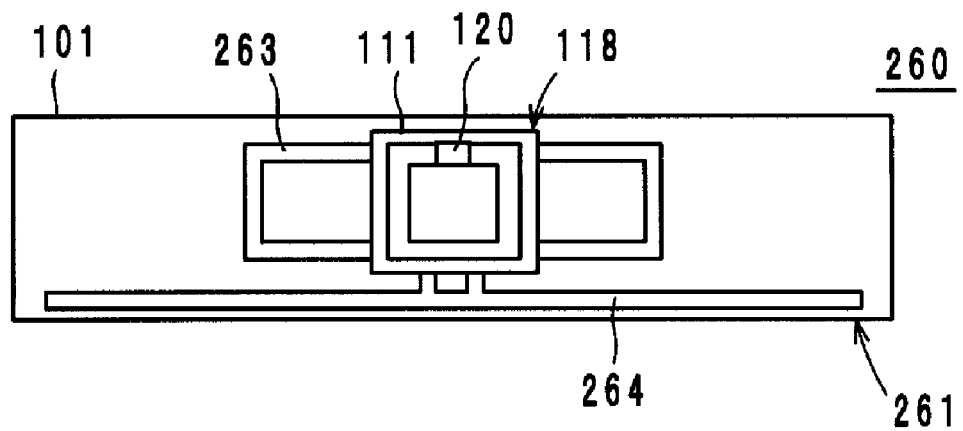

As illustrated in FIGS. 15A to 15C, a radio IC device 260 according to the seventh preferred embodiment of the present invention preferably includes the auxiliary device 118, which includes the electromagnetic coupling module 120 coupled to the loop-shaped electrode 112, mounted on a radiation electrode pattern 261, which includes a magnetic-field radiation electrode 263 and an electric-field radiation electrode 264. The magnetic-field radiation electrode 263 preferably includes a straight section 263a, a straight section 263b, a straight section 263c, a straight section 265a, a straight section 264b, a straight section 265b, a straight section 263d, a straight section 263e, and a straight section 263f. The electric-field radiation electrode 264 preferably includes a straight section 264a, a straight section 264b, and a straight section 264c. That is, the straight section 264b is preferably a common electrode section in the magnetic-field radiation electrode 263 and the electric-field radiation electrode 264. In this case, the degree of coupling between the magnetic-field radiation electrode 263 and the electric-field radiation electrode 264 increases as the space between the straight section 265a and the straight section 265b increases.

Eighth Preferred Embodiment

Figure 16A:
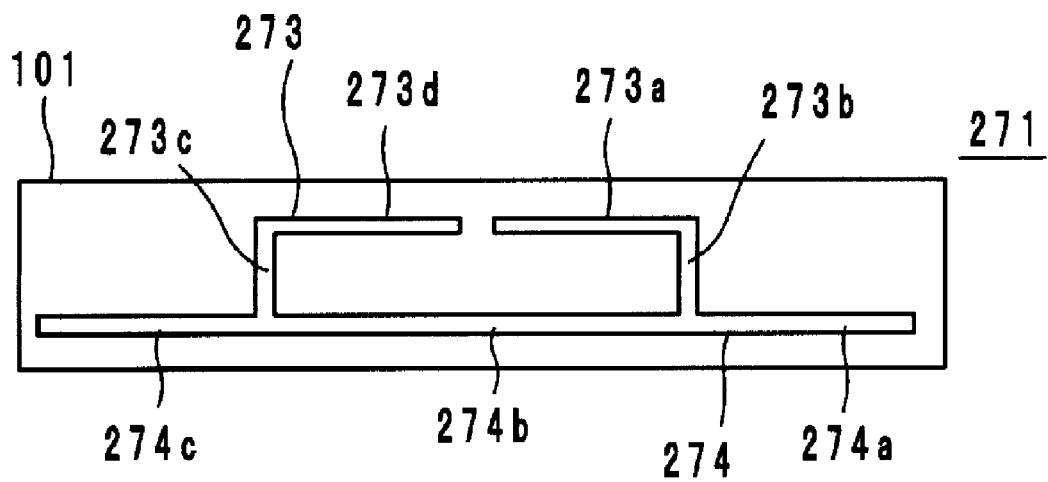
FIGS. 16A to 16C are schematic diagrams of a radio IC device according to an eighth preferred embodiment of the present invention.
Figure 16B:
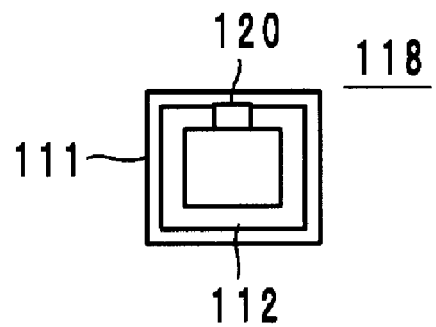
Figure 16C:
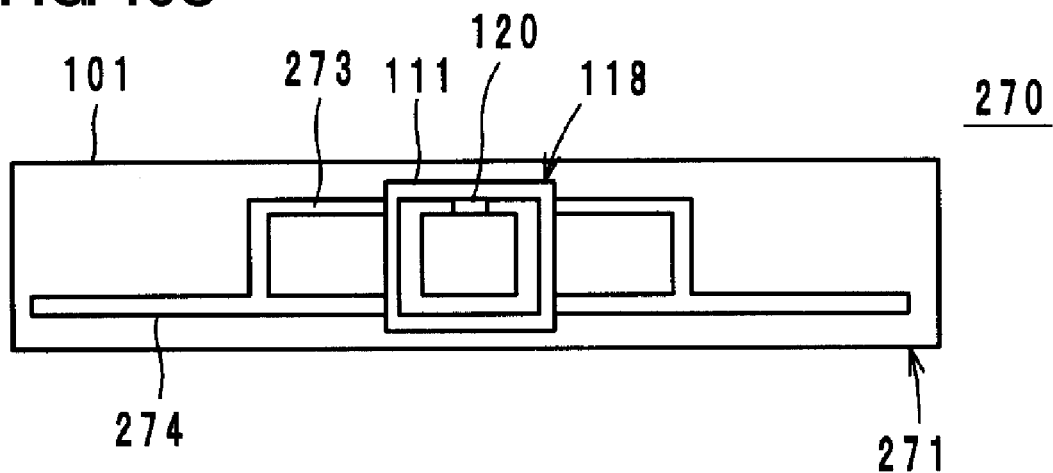

As illustrated in FIGS. 16A to 16C, a radio IC device 270 of the eighth preferred embodiment preferably includes the auxiliary device 118, which includes the electromagnetic coupling module 120 coupled to the loop-shaped electrode 112, mounted on a radiation electrode pattern 271, which includes a magnetic-field radiation electrode 273 and an electric-field radiation electrode 274. The magnetic-field radiation electrode 273 preferably includes a straight section 273a, a straight section 273b, a straight section 274b, a straight section 273c, and a straight section 273d. The electric-field radiation electrode 274 preferably includes a straight section 274a, a straight section 274b, and a straight section 274c. That is, the straight section 274b is preferably a common electrode section in the magnetic-field radiation electrode 273 and the electric-field radiation electrode 274. In this case, the degree of coupling between the magnetic-field radiation electrode 273 and the electric-field radiation electrode 274 increases as the space between the straight section 273a and the straight section 273c increases.

Ninth Preferred Embodiment

Figure 17A:
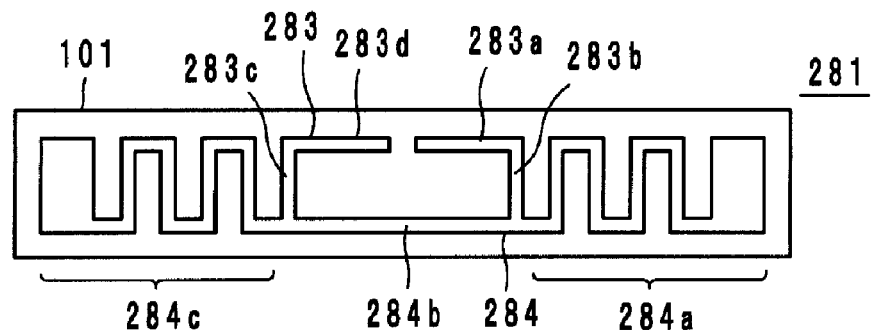
FIGS. 17A to 17C are schematic diagrams of a radio IC device according to a ninth preferred embodiment of the present invention.
Figure 17B:
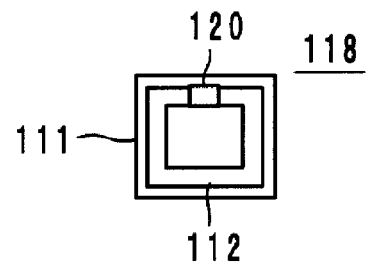
Figure 17C:
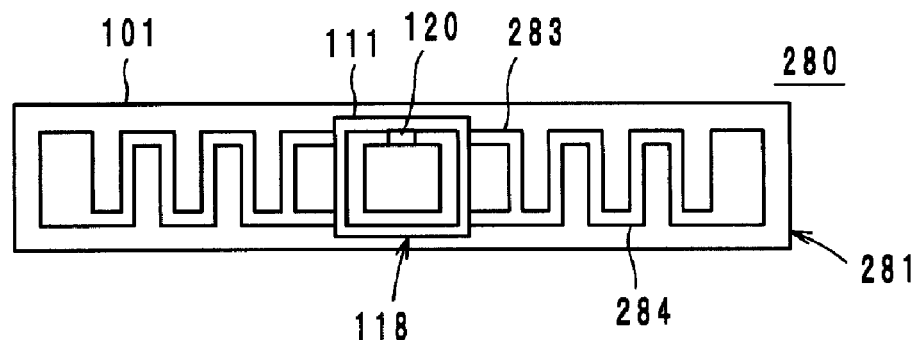

As illustrated in FIGS. 17A to 17C, a radio IC device 280 according to the ninth preferred embodiment of the present invention preferably includes the auxiliary device 118, which includes the electromagnetic coupling module 120 coupled to the loop-shaped electrode 112, mounted on a radiation electrode pattern 281, which includes a magnetic-field radiation electrode 283 and an electric-field radiation electrode 284. The magnetic-field radiation electrode 283 preferably includes a straight section 283a, a straight section 283b, a straight section 284b, a straight section 283c, and a straight section 283d. The electric-field radiation electrode 284 preferably includes a meandering section 284a, a straight section 284b, and a meandering section 284c. That is, the straight section 284b is preferably a common electrode section in the magnetic-field radiation electrode 283 and the electric-field radiation electrode 284. In this case, the degree of coupling between the magnetic-field radiation electrode 283 and the electric-field radiation electrode 284 increases as the space between the straight section 283a and the straight section 283c increases. By configuring both end portions of the electric-field radiation electrode 284 in a meandering shape, the overall size of the radiation electrode pattern 281 can be reduced.

Tenth Preferred Embodiment

Figure 18:
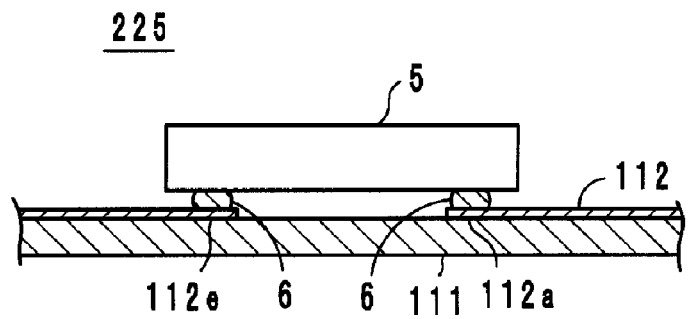
FIG. 18 is a schematic sectional view of a main portion of a radio IC device according to a tenth preferred embodiment of the present invention.

As illustrated in FIG. 18, an auxiliary device 225 preferably include the radio IC chip 5 mounted on the loop-shaped electrode 112 on the first supporting body 111. That is, without using a feeder circuit board, input/output electrodes of the radio IC chip 5 may preferably be mounted via a bonding agent 6, such as solder, for example, on the end portions of the straight line 112a and the straight line 112e of the loop-shaped electrode 112. In this case, the loop-shaped electrode 112, which defines the auxiliary electrode pattern, preferably functions as a matching circuit so as to match the input/output impedance of the radio IC chip 5 with the impedance of the radiation electrode pattern.

As described above, preferred embodiments of the present invention are useful for radio IC devices, and are particularly outstanding to improve transmission efficiency for signal energy between a radio IC and a radiation electrode pattern.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A radio IC device comprising:
   a radio IC arranged to process radio signals;
   an auxiliary electrode pattern connected to the radio IC; and
   a radiation electrode pattern coupled to the auxiliary electrode pattern and arranged to radiate the radio signals; wherein
   a portion of the auxiliary electrode pattern is coupled to a maximum-voltage section in the radiation electrode pattern through a capacitor.

2. The radio IC device according to claim 1, wherein the radiation electrode pattern is an antenna pattern including a magnetic-field radiation electrode having a predetermined resonant frequency f1 that is coupled to an electric-field radiation electrode that has a predetermined resonant frequency f2.

3. The radio IC device according to claim 2, wherein
   the auxiliary electrode pattern includes a loop-shaped electrode provided on a first supporting body; and
   the radiation electrode pattern includes the magnetic-field radiation electrode and the electric-field radiation electrode provided on a second supporting body.

4. The radio IC device according to claim 3, wherein the first supporting body is attached to the second supporting body such that a portion of the loop-shaped electrode is coupled to a maximum-voltage section in the magnetic-field radiation electrode through a capacitor.

5. The radio IC device according to claim 4, wherein the loop-shaped electrode is arranged so as to electrically extend to both of the magnetic-field radiation electrode and the electric-field radiation electrode.

6. The radio IC device according to claim 5, wherein
   the loop-shaped electrode includes a maximum-current section and a maximum-voltage section;
   the maximum-current section of the loop-shaped electrode is coupled to a maximum-current section of the electric-field radiation electrode through a magnetic field; and
   the maximum-voltage section of the loop-shaped electrode is capacitively coupled to the maximum-voltage section of the magnetic-field radiation electrode.

7. The radio IC device according to claim 1, wherein the radio IC is connected to the auxiliary electrode pattern through a feeder circuit board that includes a feeder circuit including at least one coil pattern.

8. The radio IC device according to claim 7, wherein
   the feeder circuit has a predetermined resonant frequency; and
   a frequency of the radio signal substantially corresponds to the predetermined resonant frequency of the feeder circuit.

* * * * *